United States Patent [19]
Chang et al.

[11] Patent Number: 5,604,134
[45] Date of Patent: Feb. 18, 1997

[54] PARTICLE MONITORING METHOD FOR PLASMA REACTORS WITH MOVING GAS DISTRIBUTION HOUSINGS

[75] Inventors: Kuan-Hui Chang, Hsiu-chu; Tzu-Min Peng, Hsin-chu; Po-Tao Chu, Hsin-chu; Shin-Kuei Yen, Hsin-pu, all of Taiwan

[73] Assignee: Taiwan Semiconductor Manufacturing Company, Ltd., Hsinchu, Taiwan

[21] Appl. No.: 597,493

[22] Filed: Feb. 2, 1996

[51] Int. Cl.$^6$ .............................. G01R 31/26; H01L 21/66
[52] U.S. Cl. .................................. 437/8; 437/939; 356/237
[58] Field of Search ......................... 437/8, 939; 356/237

[56] References Cited

U.S. PATENT DOCUMENTS

| | | | |
|---|---|---|---|
| 4,778,745 | 10/1988 | Leung | 356/237 |
| 5,233,191 | 8/1993 | Noguchi et al. | 437/8 |
| 5,274,434 | 12/1993 | Morioka et al. | 356/237 |

Primary Examiner—John Niebling
Assistant Examiner—Brian K. Dutton
Attorney, Agent, or Firm—George O. Saile

[57] ABSTRACT

Plasma reactors are used extensively in the manufacture of integrated circuits for the deposition and etching of thin films at low temperatures. Their range of operating temperatures and gas pressures make them highly susceptible to build-up of deposits on the inner surfaces of the reaction chamber which subsequently become dislodged by vibrations, stresses, and other aggravations and are dispersed within the system as particulates. The monitoring of particulate accumulation on wafers is conventionally done by subjecting a test wafer to a simulated operation within the tool under gas flow alone. Some types of plasma reactors incorporate oscillating gas dispersion housings in order to improve homogeneity of the gas mixture. The motion of these housings can induce significant particle displacement within the chamber. The correct monitoring procedure for these tools must therefore include the motion of the distribution housing in addition to the conventional procedures.

14 Claims, 3 Drawing Sheets

PARTICLE MONITORING METHOD FOR PLASMA REACTORS WITH MOVING GAS DISTRIBUTION HOUSINGS

BACKGROUND OF THE INVENTION

(1) Field of the Invention

This invention relates to testing and diagnostics of line processes used for the manufacture of semiconductor devices and more particularly to the measurement and monitoring of particulates in plasma etching and deposition tools.

(2) Description of Prior Art

The manufacture of large scale integrated circuits in a mass production manufacturing facility involves hundreds of discrete processing steps beginning with the introduction of blank semiconductor wafers at one end and recovering the completed chips at the other. In general the processing steps can be divided into two sections: The masterslice or front-end processing and the personalization or back-end processing. The former constitutes primarily of the high temperature processing steps wherein the discrete semiconductor devices are incorporated into to the surface of the wafers. These processes include diffusion, ion-implantation, oxidation, and epitaxial growth.

The personalization section involves lower temperature processing and comprises the formation of the interconnections of the devices by metal lines to form the various circuits. This processing is above the silicon plane and constitutes operations such as the deposition and etching of metal and insulator layers. In most instances at least two layers of metallization are required to form the hierarchy of circuits and provide pads for connection of the chip to its external package. Throughout the entire course of fabrication are photolithographic steps in which layers of masking materials are patterned and etched to create the desired design features.

The methods used to fabricate particular layers of material vary throughout the process. For example, at the beginning of processing a silicon oxide layer is usually formed by oxidation of the silicon wafer in a furnace at 900° to 1100° C. At a later point after impurities have been diffused into the silicon, such high temperature processing is no longer possible. Here, when a silicon oxide layer is required, low-pressure-chemical-vapor-deposition (LPCVD) may be used at temperatures between 550° to 700° C. After the first layer of metallization has been applied—this generally comprises an alloy of aluminum with small amounts of silicon, tungsten, or titanium—the allowable processing temperature yet further reduced. The layers can be deposited at temperatures below 400° C. by plasma-enhanced-chemical-vapor-deposition (PECVD).

The machines or tools which perform PECVD can be used both for deposition and etching of insulating films such as silicon dioxide and silicon nitride. Unfortunately, films deposited in these plasma tools are not of the same quality as those deposited at higher temperatures. They tend to contain products of the reaction as impurities and are highly subject to particulate contamination. The particulates consist of deposits nucleated within the plasma, and debris flaking from the chamber walls, wafer platform, and other chamber components. Particulates are one of the most predominant chip yield detractors and their impact is felt at nearly every step of chip manufacturing. The sources of particulates and the degree of impact varies with each process step. In back-end processing the integrity of the metal lines and their interlevel via connections are compromised by particulates. Depending upon their occurrence, the particulates cause opens and shorts within the metal lines and when present in the insulating layers they can be responsible for interlevel shorts. Worse yet, they can produce weak spots in the metal lines or the insulating layers, which can impact chip reliability.

Low temperature deposition and etching tool such as those used for PECVD or plasma etching must be carefully maintained and closely monitored in order to minimize particulate contamination. Every effort is made in the design of the tool through shielding, cooling, and the like to prevent accumulation of deposits on the internal parts and the chambers walls. Nevertheless, such deposits build up as the tool is used. Frequent cleaning is required to keep the chamber fit. Usually, a normally running tool, does not need to be cleaned after each job. However, the period of cleaning cannot be defined by a fixed number of jobs. That is to say, that routine maintenance is not sufficient to assure a reliable tool. Such conditions as high room humidity or too rapid pressure changes within the system can aggravate particulate contamination. It thus becomes imperative to have a reliable monitoring system in place to give real-time information regarding the particulate count within the plasma tool.

Morioka et al. U.S. Pat. No. 5,274,434. have described a particle monitoring method adaptable to automated VLSI manufacturing lines which is capable of examining every product wafer. The heart of their invention is a unique optical foreign particle detection system. The wafer is scanned as it passes beneath a linear multi-lens array. Oblique light is provided by a corresponding array of semiconductor lasers positioned at an angle to the wafer. The reflected light passes through a set of spatial filters which contain the repetitive information of the product chips. This information can be filtered out of the data and only the non-repetitive features representing defects or particulates are noted.

The technique also provides for the detection of the orientation of the wafer by sensing either the wafer flat-edge or other alignment marks as may be used. Thus the coordinates can be adjusted to align with the pattern. The device with it's appropriate spatial filters and computer input circuitry can be placed at various stations along the production line, for example at the loading port of an automatic LPCVD deposition tool where wafers are fed into a transfer lock from a cassette. The lock is closed, evacuated, and the wafer or wafers are exchanged with completed wafers in the deposition chamber. The completed wafers are then scanned as they pass on their way back to the cassette. This monitoring device is most suited for well-established, single-product, automated mass production lines.

The technique of this invention is more process tool specific and is intended to monitor the cleanliness of a particular type of tool, regardless of product and thus is more applicable to smaller, multi-product, production lines as well as to development lines. Consequently, it is of a less complex nature and far less costly to implement.

The standard procedure for monitoring particulates in a single wafer plasma etch/deposit tool of the type treated by this invention is to place a clean bare or oxidized silicon wafer into the tool, evacuating the tool, turning on the gas flow for 30 to 60 minutes, removing the wafer and performing a particle scan using oblique light. This procedure is normally performed once each day or once for every 500 or so wafers and the particle counts are graphed. The standard procedure fails to give reliable particle count data because the action of a major particle generator is omitted during the monitor runs but does operate during production runs.

The plasma tool benefited by this invention is provided with a gas distribution housing located above and concentric with the wafer. The distribution housing is carefully designed to distribute the reactant and carrier gases over the wafer area so that their composition is maintained uniform over the entire wafer surface. Heating is provided to the housing and to the chamber walls to prevent the accumulation of reaction product polymers on these surfaces. This task is made difficult by the fact that compositional changes in the gas take place as reactants deplete and products are formed. Furthermore, because of viscous flow at the pressures used, effective gas mixing is not accomplished. In order to achieve better gas homogeneity during a process run, the distribution housing is set into an oscillatory motion. During conventional monitoring, however, a plasma is not struck and the gas distribution housing remains motionless. It has been found that the motion of the distribution housing during plasma processing is a major cause of particle generation. Tool abnormalities such as heater malfunctions can create temperature non-uniformities causing local polymer formation. The mechanical movement then causes particulates to dislodge from these sources.

SUMMARY OF THE INVENTION

The particulate monitoring procedure taught by this invention includes the motion of the gas distribution housing. The housing is driven by chain external to the chamber which, by appropriate mechanism, imparts an up-and-down movement to the housing within the chamber. Particles from wall deposits of polymers and other films are dislodged by the vibrations of the moving housing. In addition, debris from parts of the housing drive mechanism such as degraded vacuum grease are also released. By including the housing motion, abnormal chamber wall and housing polymer accumulations are not only detected by the particle monitor wafer but their locations within the chamber are also indicated.

DESCRIPTION OF THE PREFERRED EMBODIMENT

Figure 1:
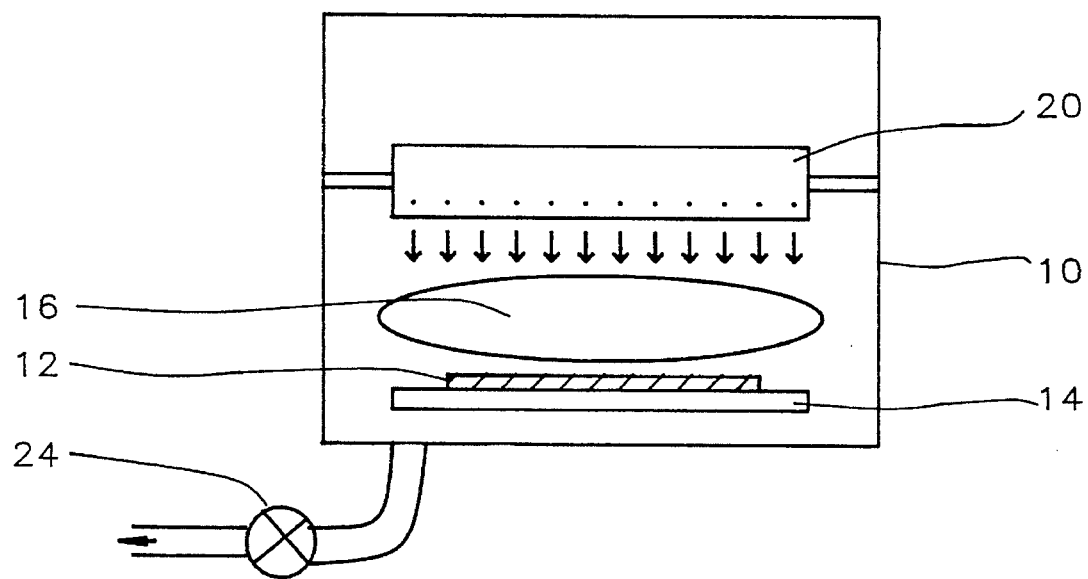
FIG. 1 is a cross-sectional representation of a plasma etching/deposition tool with a movable gas distribution housing.
Figure 4:
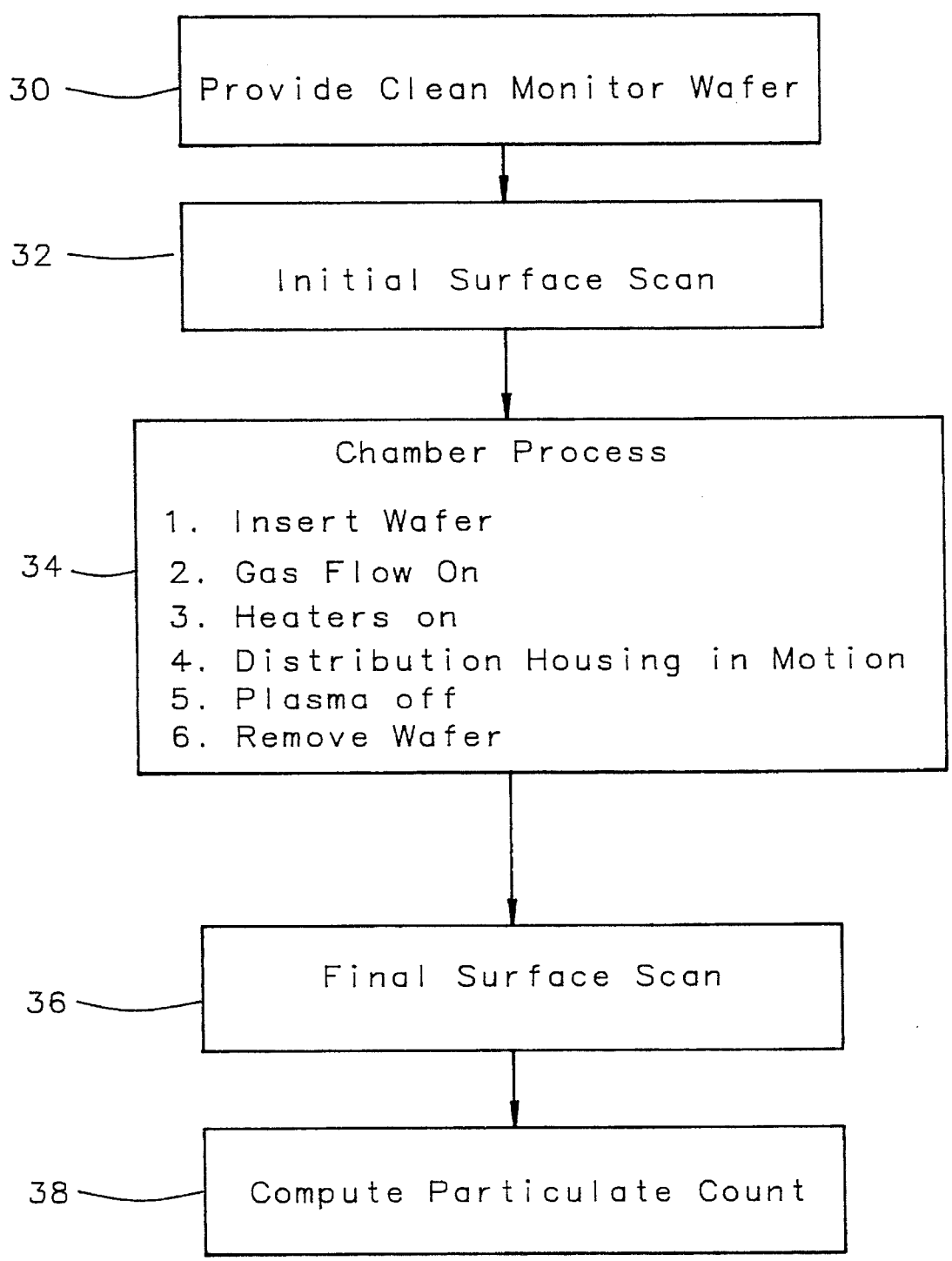
FIG. 4 gives a flow chart of the procedure of this invention.

Accordingly, referring first to FIG. 4, in a typical embodiment of this invention, a silicon substrate(wafer) is provided 30. The wafer is cleaned, inspected, and subjected to a surface scan under oblique light 32. The standard instrumentation for the surface scan provides an initial particle count and identifies the location of any particles on the wafer. The initial particle counts and their locations within a grid pattern are recorded. The wafer, now having been properly calibrated is next introduced to the chamber process 34. Referring now to FIG. 1, the wafer 12 is transferred into the chamber 10 and place onto the grounded substrate holder 14. The position of the flat edge of the wafer is always located in same orientation on the pedestal. The chamber 10 then closed and evacuated by a conventional vacuum pumping station located beneath it via port 24.

Gases containing the desired components are introduced into the reaction chamber through a port and distributed by a multi-holed housing 20, The gases are flowed in the same manner and for a time comparable to a production run except that the plasma is not struck. During the time that the gases are flowing, the distribution housing 20 is set into motion as it would be during an actual processing run. Next the gas flow is shut off and the housing motion is stopped. The wafer is then carefully removed from the chamber, usually through a loading port.

Referring again to FIG. 4, the wafer, having now been exposed to the process environment, undergoes a final examination for particulates. A surface scan 36 under oblique light is performed and the differences between the initial and final particle counts at each grid location are computed and recorded 38.

Figure 2:
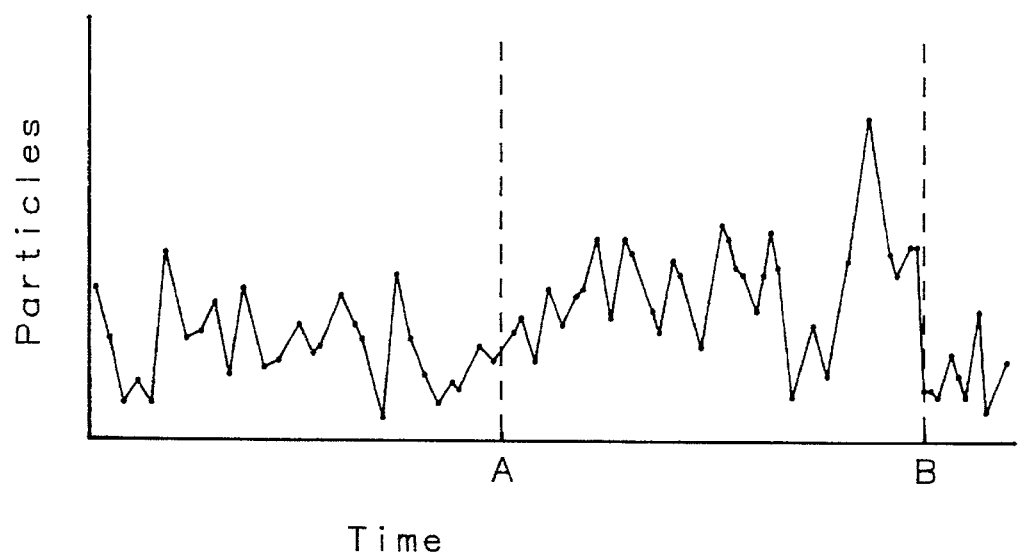
FIG. 2 is a time chart showing the daily particle count for a plasma etching tool.

Typically, a daily particle monitoring run is made on the plasma tool and the particle count is plotted on a time line as shown in FIG. 2. Daily particle counts prior to point A are representative of those made without setting the gas housing in motion. Particle counts after point A showed an increase and indicated the occurrence of a temperature non-uniformity caused by a heater malfunction. This malfunction caused local polymer formation and subsequent particle dislodgement the moving gas distribution housing. Correction of the malfunction returned the particle count to background levels after point B.

Figure 3:
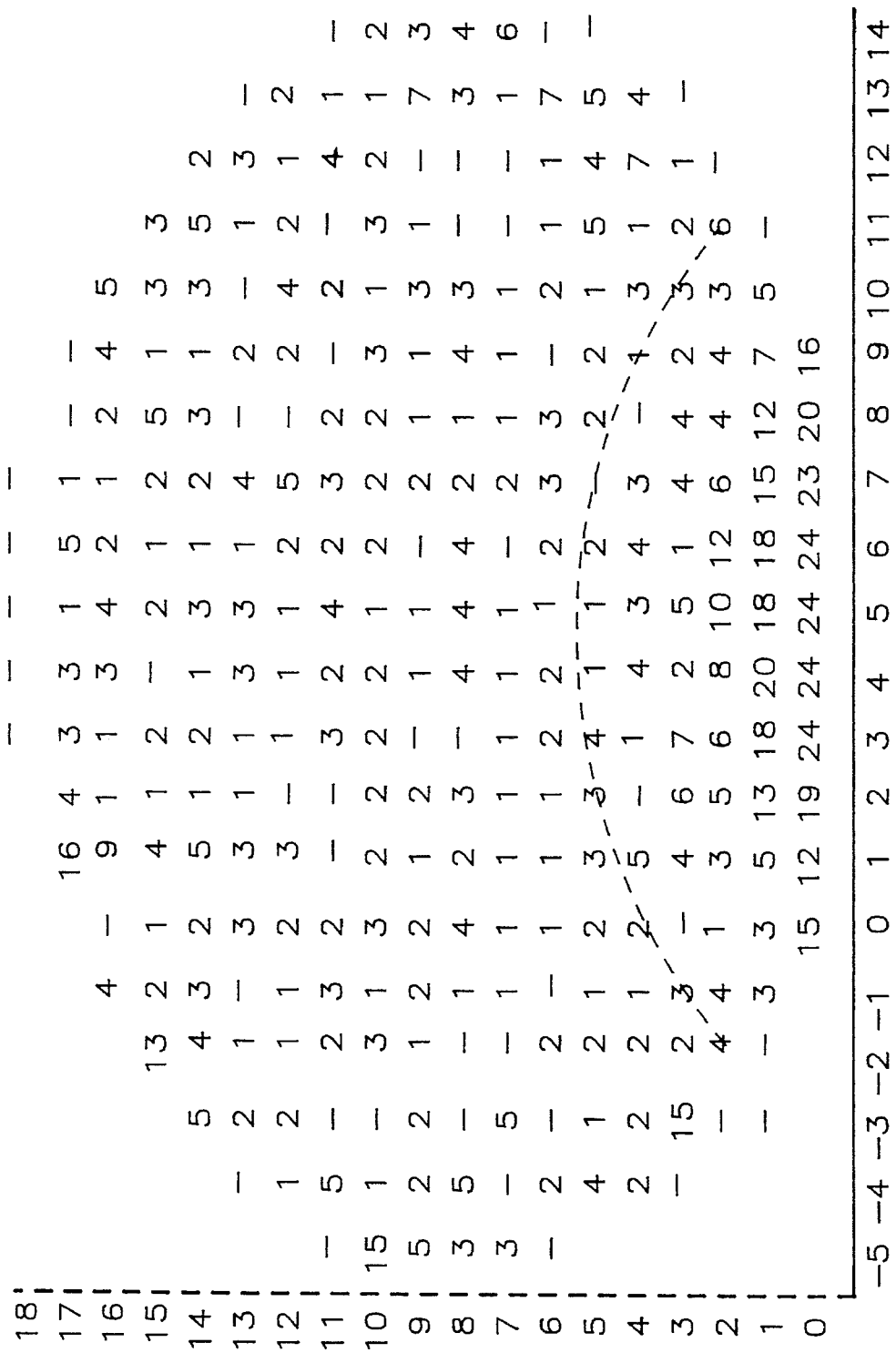
FIG. 3 is a wafer map showing the cumulative particle counts within multiple grid locations on a monitor wafer over a number of time periods.

FIG. 3 is a wafer map showing the cumulative daily particle counts over a period of time during which the heater malfunction occurred. The map shows an abnormally high density of particulates in the region of the wafer flat. This region is directly below a part of the mechanism of the moving housing. Following the correction of the heater malfunction, this region yielded particle densities commensurate with the rest of the wafer.

The plasma tool may be used in either a deposition mode(PECVD) or in a plasma etching mode. This embodiment is applicable for monitoring particulates in either mode.

While this invention has been particularly shown and described with reference to the preferred embodiments thereof, it will be understood by those skilled in the art that various changes in form and details may be made without departing from the spirit and scope of the invention.

What is claimed is:

1. A method for measuring particulate density and distribution in a plasma etching tool which has an oscillating gas distribution housing comprising:

providing a clean, particulate free semiconductor wafer;

performing an initial optical scan of said semiconductor wafer utilizing oblique light; recording the particulate count on the surface of said semiconductor wafer and the location of particulates within a grid pattern;

affixing said semiconductor wafer onto the substrate holder of said plasma etching tool;

evacuating the reaction chamber of said plasma etching tool;

flowing a mixture of reactive and carrier gases through said reaction chamber;

causing said gas distribution housing to oscillate in the manner specified for a conventional etching operation;

allowing the flow and motion of said gases to continue for a length of time;

ceasing said motion of the gas distribution housing;

ceasing said flow of gases;

returning said semiconductor wafer to atmospheric pressure;

removing said semiconductor wafer from said plasma etching tool;

performing a final optical scan of said semiconductor wafer utilizing oblique light;

recording the particulate count on the surface of said semiconductor wafer;

recording the location of said particulates within a grid pattern; and computing and recording the difference between the initial and final data.

2. The method of claim 1 wherein the plasma etching tool is a single wafer tool.

3. The method of claim 2 wherein the semiconductor wafer is loaded into the plasma etching tool through a transfer lock and wherein the lock chamber is first evacuated and the semiconductor wafer then transferred into the reaction chamber.

4. The method of claim 1 wherein the semiconductor wafer is photographed under oblique light before insertion and after removal from the reaction chamber and the photographs are scanned by an appropriate instrument and the density and location of the particulates on a prescribed grid are computed and recorded.

5. The method of claim 1 wherein the semiconductor wafer is covered by a layer of silicon oxide.

6. The method of claim 1 wherein the particulate data is taken at regular intervals and used to indicate required maintenance procedures.

7. The method of claim 1 wherein the particulate data is used to forewarn of operational divergences by revealing non-uniformities and other aberrations.

8. A method of measuring particulate density and distribution in a plasma enhanced deposition(PECVD) tool which has an oscillating gas distribution housing comprising:

providing a clean, particulate free semiconductor wafer;

performing an initial optical scan of said semiconductor wafer utilizing oblique light;

recording the particulate count on the surface of said semiconductor wafer and the location of particulates within a grid pattern;

affixing said semiconductor wafer onto the substrate holder of said PECVD tool;

evacuating the reaction chamber of said PECVD tool;

flowing a mixture of reactant and carrier gases through said reaction chamber;

causing said gas distribution housing to oscillate in the manner specified for a conventional deposition operation;

allowing the flow and motion of said gases to continue for a length of time;

ceasing said motion of the gas distribution housing;

ceasing the flow of gases;

returning said semiconductor wafer to atmospheric pressure;

removing said semiconductor wafer from said PECVD tool;

performing a final optical scan of said semiconductor wafer utilizing oblique light;

recording the particulate count on the surface of said semiconductor wafer;

recording the location of said particulates within a grid pattern; and computing and recording the difference between the initial and final data.

9. The method of claim 8 wherein the PECVD tool is a single wafer tool.

10. The method of claim 9 wherein the semiconductor wafer is loaded into the PECVO tool through a transfer lock and wherein the lock chamber is first evacuated and the semiconductor wafer then transferred into the reaction chamber.

11. The method of claim 8 wherein the semiconductor wafer is photographed under oblique light before insertion and after removal from the reaction chamber and the photographs are scanned by an appropriate instrument and the density of the particulates and their location on a prescribed grid are computed and recorded.

12. The method of claim 8 wherein the semiconductor wafer is covered by a layer of silicon oxide.

13. The method of claim 8 wherein the particulate data is taken at regular intervals and used to indicate required maintenance procedures.

14. The method of claim 8 wherein the particulate is used to forewarn of operational divergences by revealing non-uniformities and other aberrations.

* * * * *